(12) United States Patent
Lewis

(10) Patent No.: US 10,222,401 B1
(45) Date of Patent: Mar. 5, 2019

(54) SYSTEM, METHOD AND APPARATUS FOR DETECTING STRAY VOLTAGES

(71) Applicant: Dennis E. Lewis, Ware, MA (US)

(72) Inventor: Dennis E. Lewis, Ware, MA (US)

( * ) Notice: Subject to any disclaimer, the term of this patent is extended or adjusted under 35 U.S.C. 154(b) by 0 days.

(21) Appl. No.: 15/677,548

(22) Filed: Aug. 15, 2017

(51) Int. Cl.
*G01R 17/02* (2006.01)
*G08B 21/02* (2006.01)
*G01R 19/155* (2006.01)

(52) U.S. Cl.
CPC ........... *G01R 19/155* (2013.01); *G01R 17/02* (2013.01); *G08B 21/02* (2013.01)

(58) Field of Classification Search
None
See application file for complete search history.

(56) References Cited

U.S. PATENT DOCUMENTS 9,506,957 B1 * 11/2016 Branstetter ...... G01R 19/16533
2014/0062512 A1 * 3/2014 Kiing, Jr. ............... G01R 19/00
324/713

* cited by examiner

*Primary Examiner* — Thomas S McCormack
(74) *Attorney, Agent, or Firm* — Grogan, Tuccillo & Vanderleeden, LLP

(57) ABSTRACT

A device for detecting stray voltage in a body of water includes a float, a probe wire connected to the float, a voltage detection circuit electrically connected to the probe wire, and an alarm module electrically connected to the voltage detection circuit. The voltage detection circuit includes an electrical input for receiving a signal from the probe wire and is configured to generate an alert via the alarm module in response to a voltage provided to the electrical input by the probe wire.

15 Claims, 5 Drawing Sheets

SYSTEM, METHOD AND APPARATUS FOR DETECTING STRAY VOLTAGES

FIELD OF THE INVENTION

The present invention relates generally to electric devices and, more particularly, to a device for detecting stray voltages in bodies of water such as swimming pools and around boat docks.

BACKGROUND OF THE INVENTION

People, particularly in warmer weather, often spend significant amounts of time in and around bodies of water to stay cool, for recreation or for work. For example, many people around the world own swimming pools and hot tubs that are used for fun and for staying cool. Likewise, natural bodies of water such as lakes and ponds are similarly used for swimming and other types of recreation such as fishing and boating. With the increasing number of electrical devices in use today, entering a swimming pool, hot tub, lake, pond or other body of water can present hidden dangers.

For example, stray voltage may be introduced into a body of water in a number of ways, such as by accident, ageing or wear electrical components, improper installation and maintenance of electrical devices and the like. For example, voltage may be introduced into a pool or hot tub as a result of malfunctioning or improperly installed pool lights or pumps. In addition, voltage may be introduced into the area surrounding a dock in a lake or pond due to a frayed or damaged electrical cord contacting the water, or due to damaged electrical devices on the dock, such as lights, sound systems and the like.

As alluded to above, stray voltages in the water may not be readily apparent to people about to enter the water. Depending on the level of voltage in the water and the proximity of a person to the source of such voltage, injury or death can occur.

In view of the above, there is a need for a system, method and apparatus for detecting stray voltages in bodies of water such as in swimming pools, around boat docks and other locations where people may contact the water.

SUMMARY OF THE INVENTION

It is an object of the present invention to provide a system, method and apparatus for detecting stray voltage in a body of water.

It is another object of the present invention to provide an apparatus for alerting people of the presence of stray voltage in a body of water.

In an embodiment, a device for detecting stray voltage in a body of water includes a float, a probe wire connected to the float, a voltage detection circuit electrically connected to the probe wire, and an alarm module electrically connected to the voltage detection circuit. The voltage detection circuit includes an electrical input for receiving a signal from the probe wire and is configured to generate an alert via the alarm module in response to a voltage provided to the electrical input by the probe wire.

In another embodiment, a system for detecting stray voltage in a body of water includes a housing, a voltage detection circuit contained within the housing, an alarm module electrically connected to the voltage detection circuit, a probe wire having a first end connected to the voltage detection circuit and extending from the housing, and a float connected to a second end of the probe wire and positionable distal from the housing. The voltage detection circuit includes an electrical input for receiving a signal from the probe wire and is configured to generate an alert via the alarm module in response to a voltage provided to the electrical input by the probe wire.

In yet another embodiment, a method for detecting stray voltage in a body of water includes the steps of coupling a probe wire to a float device, positioning the float device in a body of water, with a voltage detection circuit electrically connected to the probe wire distal from the float, receiving a voltage signal from the probe wire, and generating an alert in dependence upon the voltage signal.

DETAILED DESCRIPTION OF THE INVENTION

Figure 1:
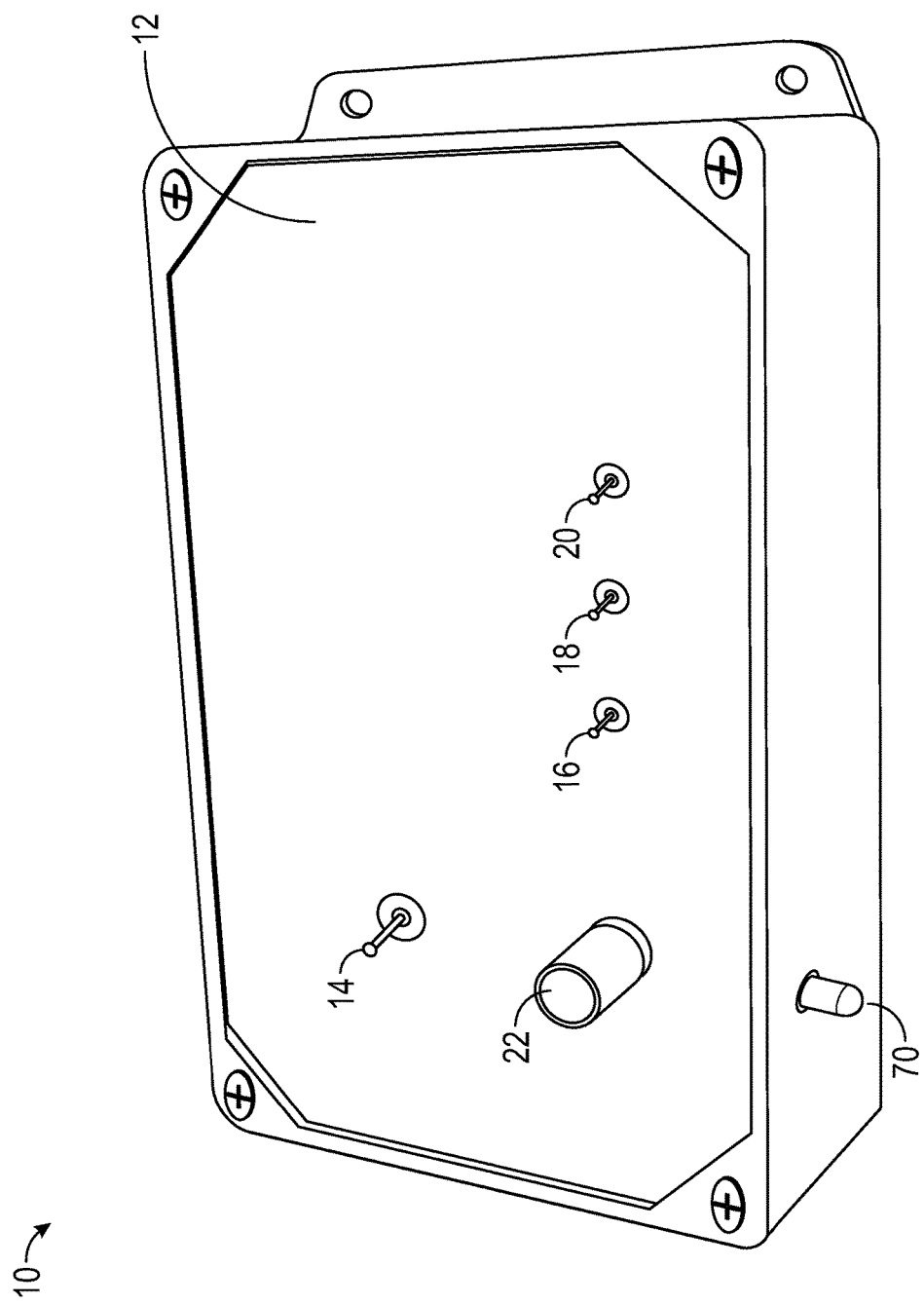
FIG. 1 is a perspective illustration of a device for detecting stray voltages in a body of water, according to an embodiment of the present invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled", "electrically connected" and "electrical communication" means that the referenced elements are directly or indirectly connected such that an electrical current may flow from one to the other. Such connections may include a direct conductive connection (i.e., without an intervening capacitive, inductive or active element), an inductive connection, a capacitive connection, and/or any other suitable electrical connection. Intervening components may be present. As will be appreciated, the terms "electrical current", "electrical power", "electrical flow", "power" and/or other similar terms are used herein to refer to the flow of electrons through one or more conducting wires, sensors, lights, motors, power transformers and/or other similar electrical devices. The term "electrical load" means a device or apparatus that consumes electrical power. Additionally, the abbreviations "VAC" and "VDC" refers to "volts alternating current" and "volts direct current", respectively.

Referring to FIGS. 1 and 2A-2C, a device 10 for detecting stray voltage in a body of water according to an embodiment of the present invention is shown. As shown therein, the device 10 includes a housing 12, a switch 14 configured to selectively activate and deactivate the device 10, a plurality of indicator lights, such as LEDs 16, 18, 20 and a warning device such as, for example, a warning light and/or alarm 22. The device 10 is electrically connected to a probe wire 100. In an embodiment, the probe wire 100 may include a float 102 or other buoyant device attached to or adjacent to the distal end of the probe wire 100. In an embodiment, the device 10 may be powered by an on-board battery, although in other embodiments it is possible that the device 10 may be connected to an external supply of electrical power.

Figure 2A:
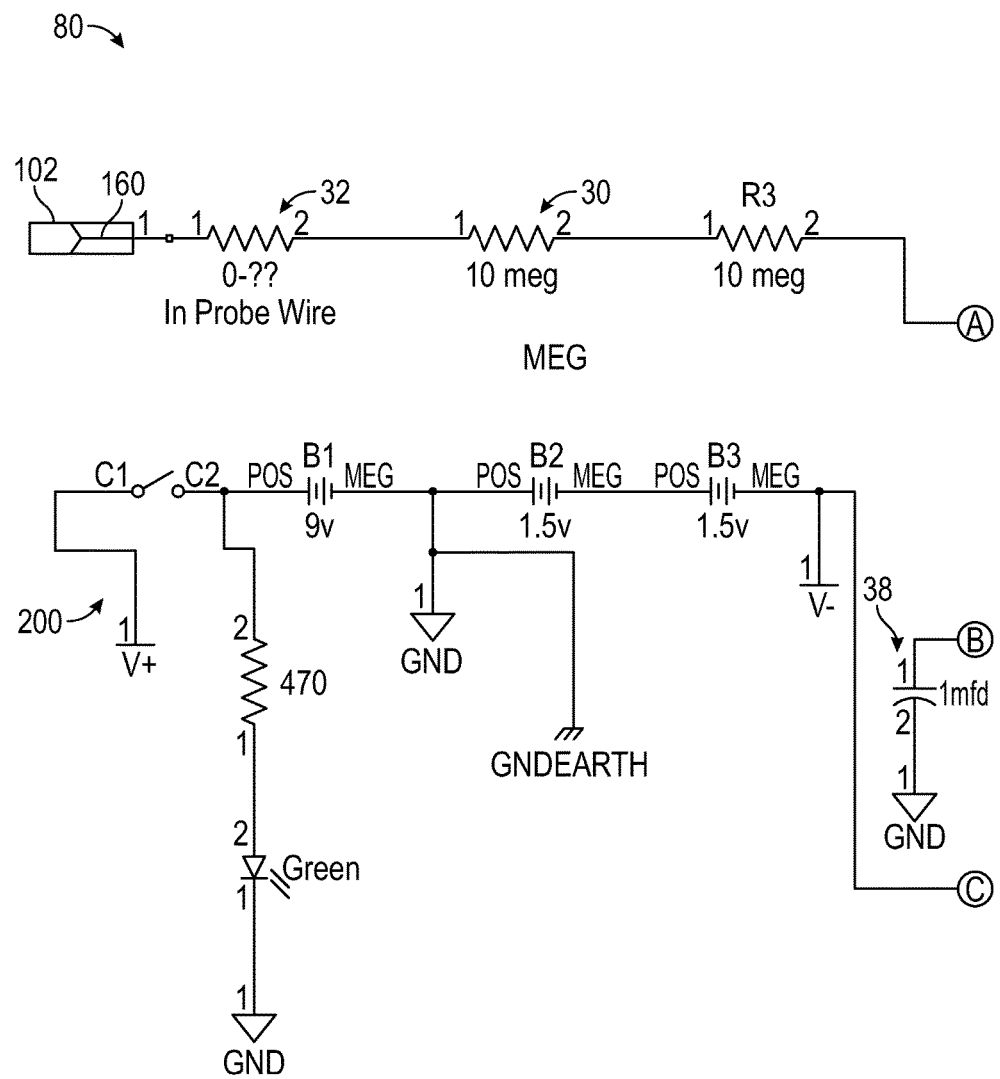
FIGS. 2A-2C show a circuit diagram of the device of FIG. 1, according to an embodiment of the present invention.
Figure 2B:
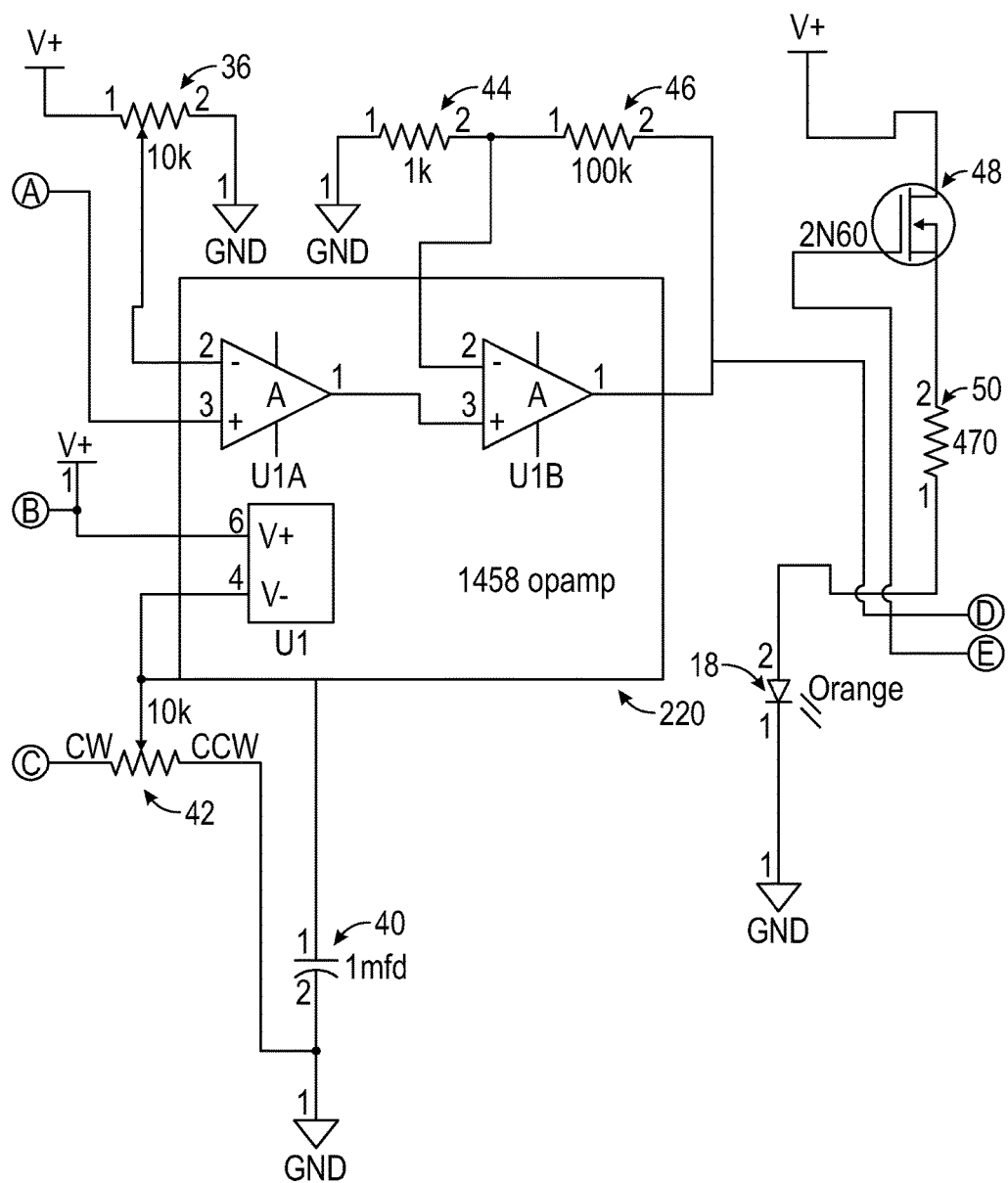
Figure 2C:
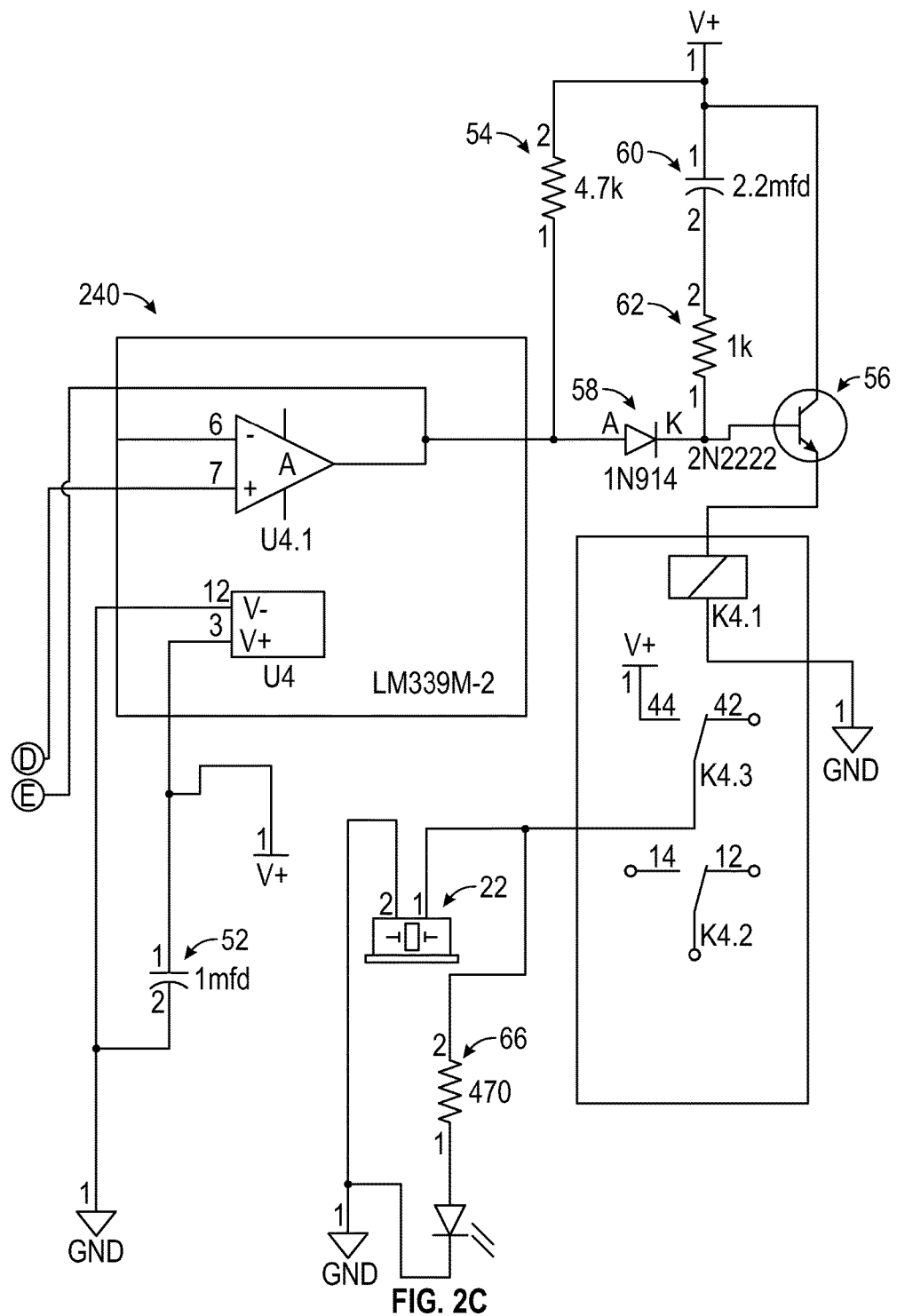

As best shown in the circuit diagram of FIGS. 2A-2C, the primary components of the device include a battery 200, an operational amplifier 220, a comparator 240, a relay 260, as well as alarm module 22, LEDs 18, 20, 22 and probe wire 100 and float 102. With reference to FIGS. 2A-2C, and working from left to right, all reference to ground are board ground except the ground labeled Earth. As illustrated therein, and as alluded to above, the device 10 may be powered by an on-board battery 24. Switch 14 may be selectively actuated to turn ON and OFF battery power. Alternatively, the switch 14 may be utilized to decouple the external power source, where utilized in place of battery power. In an embodiment, battery power may be dual with V+=9 vdc and V−=3 vdc. As shown in FIGS. 2A-2C, the circuit 80 includes a dropping resistor 26 for LED 16, which may be a green LED indicating whether the device is ON or OFF.

With further reference to FIGS. 2A-2C, the signal from the probe wire 100 goes through a first resistor 30 and second resistor 32 to the non-inverting input of U1A of operational amplifier 220. Reference number 36 indicates a 10 k potentiometer used to set the inverting input of U1A to about 2.9 vdc, which functions to stop nuisance tripping from normal body contact. The circuit also include bypass capacitors 38, 40 for stable operation of the 1458 operational amplifier 220. As illustrated therein, resistor 42 is a 10 k potentiometer lid-mounted to adjust the V− to the 1458 operation amplifier 220 in order to null the unit in a 'no detect' condition. Importantly, local conditions vary, and battery voltage changes, so the unit must be nulled in a non-detect condition.

As also shown in FIGS. 2A-2C, resistors 44, 46 are used to set the gain of U1B of the operational amplifier 220 to about 100. The output of U1A goes to the non-inverting input of U1B. A N-channel MOSFET 48 powers orange LED 18 through a dropping resistor 50. The output of U1B goes to the non-inverting input of U4, which is a single voltage, V+ comparator with inverting input held to ground. Reference number 52 denotes a bypass capacitor for U4 power. The output of U4 fires the N-channel MOSFET 48. Orange LED 18 indicates that the device 10 is zeroed when the LED is off.

Referring still to FIGS. 2A-2C, resistor 54 is a pullup resistor for U4. As shown therein, the output of U1B also goes to the base of a bipolar junction transistor 56 through diode 58. Capacitor 60 and resistor 62 are utilized for the proper operation of transistor 56. The output (emitter) of transistor 56 energizes the coil of the 5V relay 260. When latched, the relay 260 fires a red LED 20 through a dropping resistor 66 and fires the alarm module 22.

In an embodiment, for proper operation, the device 10 will typically need to sense Earth ground. Where the device 10 is a handheld unit, this can be accomplished by contacting/touching a metal screw 70 on the housing 12 exterior. For mounted units, the screw 70 on the housing 12 can be hardwired to an Earth ground.

In operation, a probe signal from probe wire 100 goes to the non-inverting input of operational amplifier U1A running as a comparator. The output of this goes to the non-inverting input of a second operational amplifier U1B running as a non-inverting amplifier. The output of the second operational amplifier U1B goes to the non-inverting input of a comparator 240 and to the base of the output transistor 56. The output of comparator 240 controls the orange LED 18.

The output of the bipolar junction transistor 56 powers the relay coil of relay 260. When energized, the relay fires the alarm module 22 and red LED 20.

Figure 3:
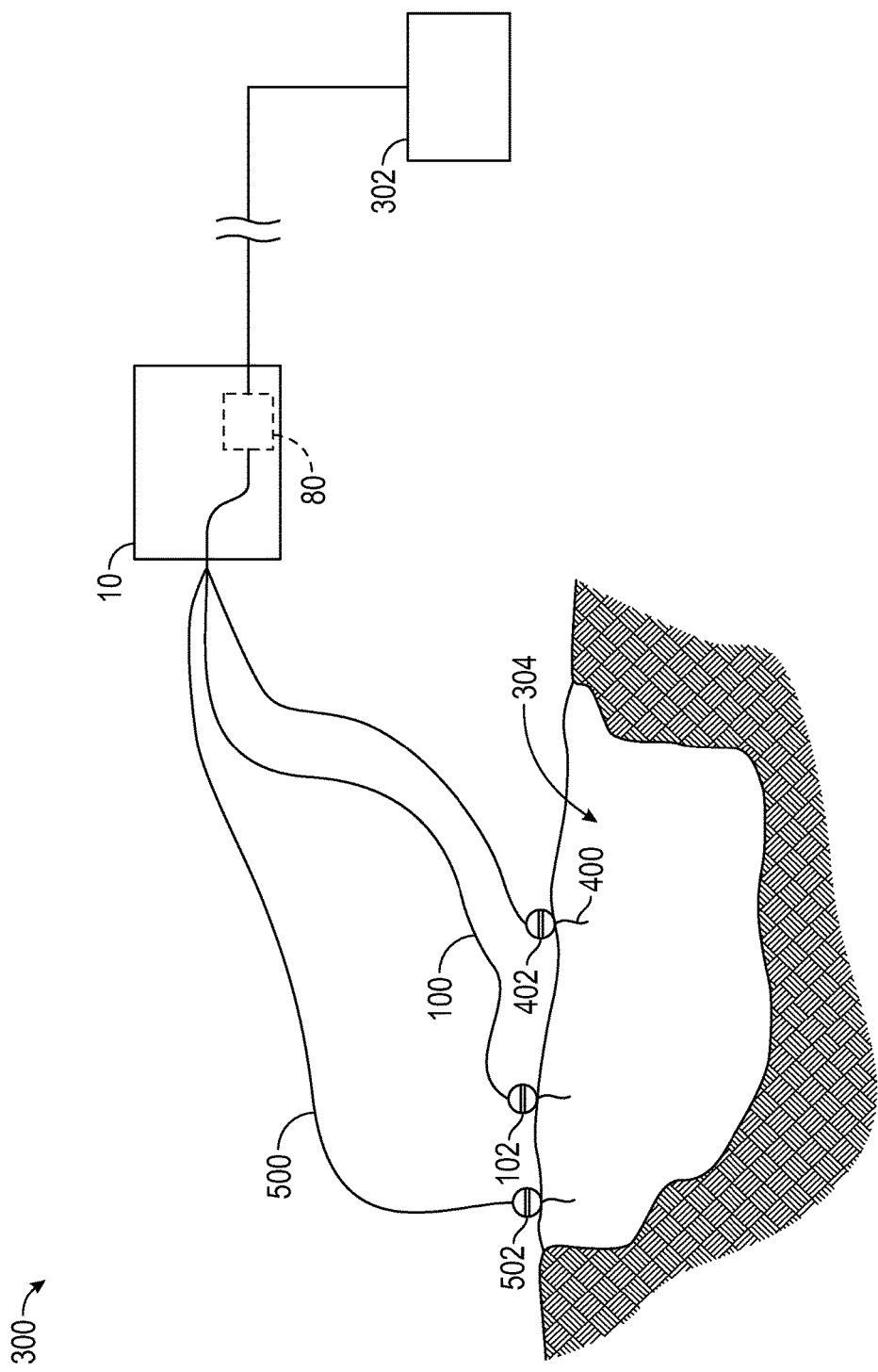
FIG. 3 is a schematic illustration of a system for detecting stray voltages in a body of water, according to an embodiment of the present invention.

Importantly, the device 10 of the present invention is therefore configured to detect stray voltages in bodies of water through float 102 and probe wire 100 thereof, and to sound an audible alarm and/or generate a visual alert if a stray voltage is detected. In an embodiment, the device 10 is configured to detect voltages as low as approximately 12 volts AC rms and at least just below 12 volts DC. In an embodiment, the device may be configured so that the alert is only generated when the detected stray voltage exceeds a threshold voltage level. Including generating one or more alarms or alerts, once a stray voltage is detected, additional post-detection steps may also be carried out or initiated by the device 10. For example, as illustrated in FIG. 3, the device 10 may be part of a system 300 and may be electrically connected or otherwise communicatively coupled to any number of alarms, controllable switches, controllable breakers, relays or other power control devices (collectively denoted as reference numeral 302) which can be activated/deactivated to generate an alert or cease the flow of electricity in a body of water 304 that may be causing the stray voltage. Any of these should be on the line side of any GFI as the GFI may be failed.

Importantly, the use of a probe wire that transmits the detected voltage signal to the voltage detection circuit allows for the detection of voltages that may not be in the immediate vicinity of the housing 12. This allows the housing 12 and its associated electronics to be mounted on a dock or on land, but to detect voltages within the water at a point distal from the housing. Accordingly, manufacturing and design costs may be kept low, as there is no need to utilize a water-tight enclosure (at least as much as the housing will not need to be physically immersed in the water). In addition, the use of a moveable probe wire allows for the detection of stray voltages in areas which are currently not occupied by persons, animals, etc., but where entry into the water may be anticipated. For example, the probe wire may easily be moved from position to position as bathers or workers move about in the water, allowing for the easy and quick detection of stray voltage before water entry. In connection with the above, the probe wire may be manufactured in almost any length, to allow for the detection of stray voltage at almost any distance with respect to the location of the housing. This level of flexibility has heretofore not been seen in the art.

While the embodiments described herein disclose a single float and a single probe wire, the present invention is not so limited in this regard. In particular, in certain embodiments, and as illustrated in FIG. 3, the system of the present invention may include a plurality of floats 102, 402, 502 each having a probe wire 100, 400, 500 associated therewith, where the probe wires are connected in parallel. The use of a plurality of floats and probes allows for voltage detection in the body of water over a larger area. That is, the use of multiple probes allows a stray voltage detection 'net' to be cast over a broad area where swimmers, workers or the like may be entering the water, to provide for an even greater level of safety.

Although this invention has been shown and described with respect to the detailed embodiments thereof, it will be understood by those of skill in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention not be limited to the particular embodiments disclosed in the above detailed description, but that the invention will include all embodiments falling within the scope of this disclosure.

What is claimed is:

1. A device for detecting stray voltage in a body of water, comprising:
    a float;
    a probe wire connected to the float;
    a voltage detection circuit electrically connected to the probe wire; and
    an alarm module electrically connected to the voltage detection circuit;
    wherein the voltage detection circuit includes an electrical input for receiving a signal from the probe wire and is configured to generate an alert via the alarm module in response to a voltage provided to the electrical input by the probe wire;
    wherein the voltage detection circuit includes a first operational amplifier running as a comparator for receiving the signal from the probe wire, a second operational amplifier running as a non-inverting amplifier for receiving an output form the first operational amplifier, and a comparator and a transistor for receiving an output of the second operational amplifier; and
    wherein the transistor is configured to power a relay coil of a relay that, when energized fires the alarm module.

2. The device of claim 1, wherein:
    the voltage detection circuit is configured to generate a visual alert via at least one indicator LED.

3. The device of claim 2, wherein:
    the at least one indicator LED is a red indicator LED.

4. The device of claim 1, wherein:
    the alert is an audible alarm.

5. The device of claim 1, wherein:
    the float is a plurality of floats; and
    the probe wire is a plurality of probe wires connected in parallel.

6. The device of claim 1, wherein:
    the voltage detection circuit is configured to detect voltages as low as about 12 volts AC.

7. The device of claim 1, further comprising:
    an on-board battery configured to power the device.

8. The device of claim 1, wherein:
    the voltage detection circuit is configured to activate or deactivate at least one of a remote alarm, a controllable switch, a controllable breaker, a relay and a power control device located remote from the device in response to the voltage provided to the electrical input by the probe wire.

9. A system for detecting stray voltage in a body of water, comprising:
    a housing;
    a voltage detection circuit contained within the housing;
    an alarm module electrically connected to the voltage detection circuit;
    a probe wire having a first end connected to the voltage detection circuit and extending from the housing; and
    a float connected to a second end of the probe wire and positionable distal from the housing;
    wherein the voltage detection circuit includes an electrical input for receiving a signal from the probe wire and is configured to generate an alert via the alarm module in response to a voltage provided to the electrical input by the probe wire;
    wherein the voltage detection circuit includes a first operational amplifier running as a comparator for receiving the signal from the probe wire, a second operational amplifier running as a non-inverting amplifier for receiving an output form the first operational amplifier, and a comparator and a transistor for receiving an output of the second operational amplifier;
    wherein the transistor is configured to power a relay coil of a relay that, when energized fires the alarm module.

10. The system of claim 9, further comprising:
    at least one indicator LED on the housing;
    wherein the voltage detection circuit is configured to generate a visual alert via the at least one indicator LED in response to the voltage being provided to the electrical input.

11. The system of claim 10, wherein:
    the at least one indicator LED is a red indicator LED.

12. The system of claim 10, wherein:
    the alert is an audible alarm.

13. The system of claim 9, wherein:
    the float is a plurality of floats; and
    the probe wire is a plurality of probe wires connected in parallel.

14. The system of claim 9, further comprising:
    at least one of a remote alarm, a controllable switch, a controllable breaker, a relay and a power control device in communication with the voltage detection circuit;
    wherein the voltage detection circuit is configured to activate or deactivate the at least one of the remote alarm, the controllable switch, the controllable breaker, the relay and the power control device in response to the voltage provided to the electrical input by the probe wire.

15. The system of claim 9, wherein:
    the voltage detection circuit is configured to detect voltages as low as about 12 volts AC.

* * * * *